(12) United States Patent
Steirer et al.

(10) Patent No.: US 9,543,537 B2
(45) Date of Patent: Jan. 10, 2017

(54) SOLUTION PROCESSED METAL OXIDE THIN FILM HOLE TRANSPORT LAYERS FOR HIGH PERFORMANCE ORGANIC SOLAR CELLS

(71) Applicant: Alliance for Sustainable Energy, LLC, Golden, CO (US)

(72) Inventors: K. Xerxes Steirer, Golden, CO (US); Joseph J. Berry, Boulder, CO (US); Jordan P. Chesin, Cambridge, MA (US); Matthew T. Lloyd, Boulder, CO (US); Nicodemus Edwin Widjonarko, Golden, CO (US); Alexander Miedaner, Boulder, CO (US); Calvin J. Curtis, Lakewood, CO (US); David S. Ginley, Evergreen, CO (US); Dana C. Olson, Boulder, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 104 days.

(21) Appl. No.: 14/156,712

(22) Filed: Jan. 16, 2014

(65) Prior Publication Data

US 2014/0134781 A1  May 15, 2014

Related U.S. Application Data

(62) Division of application No. 13/301,389, filed on Nov. 21, 2011, now abandoned.

(Continued)

(51) Int. Cl.
*H01L 51/44* (2006.01)
*H01L 51/42* (2006.01)
*H01L 51/00* (2006.01)

(52) U.S. Cl.
CPC ......... *H01L 51/442* (2013.01); *H01L 51/4253* (2013.01); *H01L 51/4273* (2013.01); *H01L 51/0036* (2013.01); *Y02E 10/549* (2013.01)

(58) Field of Classification Search
CPC .............. H01L 51/442; H01L 51/4253; H01L 51/4273; H01L 51/0036; H01L 51/44; Y02E 10/549
See application file for complete search history.

(56) References Cited

U.S. PATENT DOCUMENTS 5,132,140 A   7/1992  Goda et al.
5,711,803 A   1/1998  Pehnt et al.
(Continued)

FOREIGN PATENT DOCUMENTS

WO   2007001468   1/2007
WO   2009059302   5/2009
(Continued)

OTHER PUBLICATIONS

Lee et al., "Structural, optical, and electrical properties opf p-type NiO films and composite TiO2/NiO electrodes for solid-state dye-sensitized solar cells"; Applied Surface Science, 255 (2009) 4658-4663.*

(Continued)

*Primary Examiner* — Scott B Geyer
(74) *Attorney, Agent, or Firm* — Michael A. McIntyre

(57) ABSTRACT

A method for the application of solution processed metal oxide hole transport layers in organic photovoltaic devices and related organic electronics devices is disclosed. The metal oxide may be derived from a metal-organic precursor enabling solution processing of an amorphous, p-type metal oxide. An organic photovoltaic device having solution processed, metal oxide, thin-film hole transport layer.

17 Claims, 5 Drawing Sheets

Related U.S. Application Data

(60) Provisional application No. 61/415,612, filed on Nov. 19, 2010.

(56) References Cited

U.S. PATENT DOCUMENTS

| | | | |
|---|---|---|---|
| 5,776,254 | A | 7/1998 | Yuuki et al. |
| 6,126,740 | A | 10/2000 | Schulz et al. |
| 6,436,305 | B1 | 8/2002 | Schulz et al. |
| 6,830,778 | B1 | 12/2004 | Schulz et al. |
| 6,951,666 | B2 | 10/2005 | Kodas et al. |
| 6,951,694 | B2 | 10/2005 | Thompson et al. |
| 7,014,979 | B2 | 3/2006 | Byun et al. |
| 7,208,872 | B2 | 4/2007 | Miyadera |
| 7,535,017 | B2 | 5/2009 | Wittmann et al. |
| 7,799,990 | B2 | 9/2010 | Marks et al. |
| 8,093,491 | B2 | 1/2012 | Sridharan et al. |
| 8,641,931 | B2 | 2/2014 | Ginley et al. |
| 2004/0005412 | A1 | 1/2004 | Byun et al. |
| 2004/0261839 | A1 | 12/2004 | Gee et al. |
| 2005/0078158 | A1 | 4/2005 | Magdassi et al. |
| 2005/0277274 | A1 | 12/2005 | Karkkainen |
| 2006/0001726 | A1 | 1/2006 | Kodas et al. |
| 2006/0043346 | A1 | 3/2006 | Kodas et al. |
| 2006/0060757 | A1 | 3/2006 | Takiba et al. |
| 2006/0081840 | A1 | 4/2006 | Mori et al. |
| 2006/0208257 | A1 | 9/2006 | Branz et al. |
| 2006/0231804 | A1 | 10/2006 | Wang et al. |
| 2007/0163634 | A1 | 7/2007 | Wada et al. |
| 2008/0003364 | A1 | 1/2008 | Ginley et al. |
| 2008/0145520 | A1 | 6/2008 | Yumoto |
| 2008/0193793 | A1 | 8/2008 | Johannes et al. |
| 2009/0044855 | A1 | 2/2009 | Irwin et al. |
| 2009/0188556 | A1 | 7/2009 | Castillo et al. |
| 2009/0229670 | A1 | 9/2009 | Kitamura et al. |
| 2009/0280624 | A1 | 11/2009 | Curtis et al. |
| 2009/0283141 | A1 | 11/2009 | Bentzen et al. |
| 2009/0293956 | A1 | 12/2009 | Kitamura |
| 2010/0012178 | A1 | 1/2010 | Yang et al. |
| 2010/0089636 | A1 | 4/2010 | Ramadas et al. |
| 2010/0163810 | A1 | 7/2010 | Ginley et al. |
| 2010/0209594 | A1 | 8/2010 | Curtis et al. |
| 2010/0300522 | A1 | 12/2010 | Ginley et al. |
| 2011/0108116 | A1 | 5/2011 | Kang et al. |
| 2011/0223433 | A1 | 9/2011 | Hammond et al. |
| 2012/0015147 | A1* | 1/2012 | Maa et al. ............. 428/148 |
| 2012/0060910 | A1 | 3/2012 | Schoenfeld et al. |
| 2012/0094019 | A1 | 4/2012 | Inaba et al. |
| 2012/0132272 | A1 | 5/2012 | Steirer et al. |
| 2012/0216870 | A1 | 8/2012 | So et al. |
| 2012/0288991 | A1 | 11/2012 | Abed et al. |
| 2013/0061931 | A1 | 3/2013 | Lim et al. |
| 2014/0256081 | A1 | 9/2014 | Hammond et al. |

FOREIGN PATENT DOCUMENTS

| | | |
|---|---|---|
| WO | 2010140980 A1 | 12/2010 |
| WO | 2011/027549 | 3/2012 |
| WO | WO 2014/138558 A1 | 9/2014 |

OTHER PUBLICATIONS

Kumagai et al. "Preparation and characteristics of nickel oxide thin film by controlled growth with sequential surface chemical reactions"; Journal of Material Science Letters, 15 (1996) 1081-1083.*
Boschloo et al. "Spectroelectrochemistry of nanostructured NiO"; J. Phys. Chem. B, 2001, 105, 3039-3044.*
Vera et al. "Preparation and characterization of Eosin B- and Erythrosin J-sensitized nanostructured NiO thin film photocathodes"; Thin Solid Films, 490 (2005), 182-188.*
Zayim et al. "Sol-gel deposited nickel oxide films for electrochromic applications"; Solar Energy Materials & Solar Cells, 92 (2008), 164-169.*

Ohya et al. "Electrical properties of p-n contact with oxide semiconductor thin films fabricated by liquid phase method"; Materials Science and Engineering, B54 (1998), 55-59.*
Nakaoka et al. "Semiconductor and electrochromic properties of electrochemically deposited nickel oxide films"; Journal of Electroanalytical Chemistry, 571 (2004), 93-99.*
Li, et al., "High-efficiency solution processable polymer photovoltaic cells by self-organization of polymer blends," Nature Materials, vol. 4, Nov. 2005, pp. 864-868.
Irwin, et al., "p-Type semiconducting nickel oxide as an efficiency-enhacing anode interfacial layer in polymer bulk-heterojunction solar cells", Natl Acad Sci U S A, Feb. 26, 2008, 105(8); 2783-2787.
Li, et al., "Solution-Processable Graphene Oxide as an Efficient Hole Transport Layer in Polymer Solar Cells", ACSNANO vol. 4, No. 6, Jun. 2010, pp. 3169-3174.
Berry, et al., "Mixed Metal Oxide Systems for Organic Photovoltaics", IEEE, Photovoltaic Specialists Conference, Jun. 7-12, 2009 pp. 1448-1451.
Steirer, "Solution deposited NiO thin-films as hole transport layers in organic photovoltaics", Organic Electronics, vol. 11, Issue 8, Aug. 2010, pp. 1414-1418.
Bailey, et al., "Nickel Oxide as an Inorganic Hole Transport Layer in Organic Photovoltaics", American Physical Society, Fall 2009 Meeting of the the Four Corners Section of the APS, Oct. 23-24, 2009, abstract #D1.050, http://meetings.aps.org/link/BAPS.2009.4CF.D1.50.
Shaheen, et al., "2.5% efficient organic plastic solar cells," Applied Physics Letters, vol. 78, Issue 6, Feb. 5, 2001, pp. 841-843.
Chen, et al., "Polymer solar cells with enhanced open-circuit voltage and efficiency," Nature Photonics, vol. 3, No. 11, Nov. 2009, pp. 649-653.
Scharber, et al., "Design rules for donors in bulk-heterojunctions solar cells—towards 10% energy-conversion efficiency," Advanced Materials, vol. 18, No. 6, Mar. 2006, pp. 789-794.
Blouin, et al., "Toward a rational design of poly(2,7-carbazole) derivatives for solar cells," Journal of the American Chemical Society, vol. 130, No. 2, Jan. 2008, pp. 732-742.
Sariciftci, et al., "Photoinduced electron transfer from a conducting polymer to Buckminsterfullerene," Science, vol. 258, Nov. 27, 1992, pp. 1474-1476.
Yu, et al., "Polymer photovoltaic cells: echanced efficiencies via a network of internal donor-acceptor heterojunctions," Science, vol. 270, Dec. f15, 1995, pp. 1789-1791.
Halls, et al., "Efficient photodiodes from interpenetrating polymer networks," Letters to Nature, vol. 376, Aug. 10, 1995, pp. 498-500.
Blouin, et al., "A low-bandgap poly(2,7 carbazole) derivative for use in high-performance solar cells," Advanced Materials, vol. 19, No. 17, Sep. 2007, pp. 2295-2300.
Hains, et al., "High-efficiency hole extraction/electron-blocking layer to replace poly )3 4-ethylenedioxythiophene:poly(styrene sulfonate) in bulk-heterojunction polymer solar cells," Applied Physics Letters, vol. 92, Issue 2, Jan. 2008, pp. 0235041-0235043.
Zhao, et al., "An inverted organic solar cell with an ultrathin Ca electron-transporting layer and MoO[sub 3] hole-transporting layer," Applied Physics Letters, vol. 92, Issue 15, Oct. 2009, pp. 1533041-1533043.
Roman, et al., "Polymer diodes with high rectification," Applied Physics Letters, vol. 75, Issue 22, Nov. 29, 1999, pp. 3557-3559.
Wang, et al., "Influence of PEDOT:PSS buffer layer on the performance of organic photocoupler," Optoelectronics Letters, vol. 5, No. 3, May 1, 2009, pp. 0173-0176.
De Jong, et al., "Stability of the interface between indium-tin-oxide and poly(3,4-ethylenedioxythiophene)/ ploy(styrenesulfonate) in polymer light-emitting diodes," Applied Physics Letters, vol. 77, Issue 14, Oct. 2000, pp. 2255-2257.
Vitoratos, et al., "Thermal degradation mechanisms of PEDOT:PSS," Organic Electronics, vol. 10, Issue 1, Feb. 2009, pp. 61-66.
Greczynski, et al., "Photoelectron spectroscopy of thin films of PEDOT-PSS conjugated polymer blend: a mini-review and some new results," Journal of Electron Spectroscopy and Related Phenomena, vol. 121(1-3), Dec. 2001, pp. 1-17.

(56) References Cited

OTHER PUBLICATIONS

Zhang, et al., "Energy level alignment and morphology of interfaces between molecular and polymeric organic semiconductors," Organic Electronics, vol. 8, Issue 5, Oct. 2007, pp. 606-614.
Hwang, et al., "Spectroscopic study on sputtered PEDOT-PSS: role of surface PSS layer," Organic Electronics, vol. 7, Issue 5, Oct. 2006, pp. 387-396.
Berry, et al., "Surface treatment of NiO hole transport layers for organic solar cells," IEEE Journal of Selected Topics in Quantum Electronics, vol. 16, No. 6, Nov./Dec. 2010, pp. 1649-1655.
Wu, et al., "Surface modification of indium tin oxide by plasma treatment: an effective method to improve the efficiency, brightness, and reliability of organic light emitting devices," Applied Physics Letters, vol. 70, Issue 11, Mar. 1997, pp. 1348-1350.
Park, et al., "Bulk heterojunction solar cells with internal quantum efficiency approaching 100%," Nature Photonics, vol. 3, No. 5, May 2009, pp. 297-302.
Tengstedt, et al., "Fermi-level pinning at conjugated polymer interfaces," Applied Physics Letters, vol. 88, Issue 6, Jan. 2006, pp. 0535021-0535023.
Braun, et al., "Energy-level alignment at organic/metal and organic/organic interfaces," Advanced Materials, vol. 21 (14-15), Apr. 2009, pp. 1450-1472.
Xu, et al., "Energy level alignment of poly(3-hexylthiophene): [6,6]-phenyl C[sub61] butyric and acid methyl ester bulk heterojunction," Applied Physics Letters, vol. 95, Issue 1, May 2009, pp. 013301-013303.
Potscavage, Jr., et al., "Origin of the open-circuit voltage in multilayer heterojunction organic solar cells," Applied Physics Letters, Vo. 93, Issue 19, Nov. 2008, pp. 1933081-1933082.
Waldauf, et al., "Physics of organic bulk heterojunction devices for photovoltaic applications," Journal of Applied Physics, vol. 99, Issue 10, May 2006, pp. 1045031-1045036.
Lloyd, et al., "Impact of contact evolution on the shelf life of organic solar cells," Journal of Materials Chemistry, vol. 19, No. 41, Nov. 7, 2009, pp. 7569-7780.
Kawano, et al., "Degradation of organic solar cells due to air exposure," Solar Energy Materials and Solar Cells, vol. 90, Issue 20, Dec. 15, 2006, pp. 3520-3530.
Moule, et al., "The effect of active layer thickness and composition on the performance of bulk-heterojunction solar," Journal of Applied Physics, vol. 100, Issue 9, Nov. 2009, pp. 0945031-0945037.
Pettersson, et al.,k "Modeling photocurrent action spectra of photovoltaic devices based on organic thin films," Journal of Applied Physics, vol. 86, Issue 1, Jul. 1999, pp. 487-496.
Heliatek Press Release, "Heliatek achieves new world record for organic solar cells with certified 9.8% cell efficiency," accessed Sep. 24, 2013.
Jorgensen, et al., "Stability/degradation of polymer solar cells," Solar Energy Materials & Solar Cells, vol. 92, No. 7, Jul. 2008, pp. 686-714.
Lyon, et al., "Photoemission study of the poly(3-hexylthiophene)/Au interface," Applied Physics Letters, vol. 88, Issue 22, May 2006, pp. 222109-1-222109-3.
Calvert, "Inkjet Printing for Materials and Devices," Chemical Materials, vol. 13, Issue 10, Oct. 2001, pp. 3299-3305.
Curtis, "Metallizations by Direct-Write Inkjet Printing," 2001, NREL/CP-520-31020, pp. 1-4, National Renewable Energy Laboratory, Golden, Colorado USA.
Di Risio, et al., "Plezoelectric Ink-Jet Printing of Horseradish Peroxidase: Effect of Ink Viscosity Modifiers on Activity," Macromolecular Rapid Communications, vol. 28, Issue 18-19, Sep. 28, 2007, pp. 1934-1990.
Ginley, et al, "Inkjet Direct Write Solar Cells," Dec. 7, 2005, Contract Number, RD-93, Report No. 1, National Renewable Energy Laboratory, Golden, Colorado USA.
Ginley, et al, "Inkjet Direct Write Solar Cells," Feb. 6, 2006, Contract Number, RD-93, Report No. 3, National Renewable Energy Laboratory, Golden, Colorado USA.

Jang, et al, "Influence of Fluid Physical Properties on Ink-Jet Printability," Langmuir, vol. 25, Issue 5, Mar. 3, 2009, pp. 2629-2635.
Kang, "Water-Based Ink-Jet I. Formulation," Journal of Imaging Science, May/Jun. 1991, vol. 35, No. 3, pp. 179-188, IS&T—The Society for Imaging Science and Technology.
Kang, "Water-Based Ink-Jet Ink. II Characterization," Journal of Imaging Science, May/Jun. 1991, vol. 35, No. 3, pp. 189-194, IS&T—The Society for Imaging Science and Technology.
Kang, "Water-Based Ink-Jet Ink. III Performance Studies," Journal of Imaging Science, May/Jun. 1991, vol. 35, No. 3, pp. 195-201, IS&T—The Society for Imaging Science and Technology.
Kaydanova et al., "Direct Write Contacts for Solar Cells, Conference Paper," NRELCP-520-37524, 31st IEEE Photovoltaics Specialist Conference and Exhibition, Lake Buena Vista, Florida, Jan. 3-7, 2005.
Kaydanova et al., "Ink Jet Printing Approaches to Solar Cell Contacts," NREL/CP-520-33594, National Center for Photovoltaics and Solar Program Review Meeting, Denver, Colorado, Mar. 24-23, 2033.
Yancey, "Direct Write Metallizations with Orgamometallic Inks," DOE Energy Research Undergraduate Laboratory Fellowship, National Renewable Energy Laboratory, Golden, Colorado, Aug. 18, 2000, pp. 1-19.
Schubert et al., "Current Transport Mechanism in Printed AG Thick Film Contact to an N-Type Emitter of a Crystalline Silicon Solar Cell," 19th European Solar Energy Conference and Exhibition, Jun. 7-11, 2004, Paris, France.
Rivkin et al., "Direct Processing for Photovoltaic Cells," 12th Worksop on Crystalline Silicon Solar Cell Materials and Processes Aug. 2020, National Renewable Energy Laboratory/BK-520-32717, pp. 1326-1329.
Hoornstra et al., "Lead Free Metallisation Paste for Crystalline Silicon Solar Cells: From Model to Results," Conference Record of the Thirty-First IEEE Photovoltaic Specialists Conference, Orlando, Florida, Jan. 3-7, 2005, pp. 1293-1296.
Ballif, et al., Silver-thick-film contacts on highly doped n-type silicon emitters; Structural and electronic properties of the interface, Applied Physics Letters, vol. 82, Issue 12, Mar. 24, 2003, pp. 1878-1880.
Sridharan, et al., "Lead Free Silver Front Contact Pastes for SiNx Coated Polycrystalline Silicon Solar Cells," International PVSEC-15 Shanghai, China, 2005, pp. 1-2.
Hoornstra, et al., "Lead free metallisation for silicon solar cells: results from the EC2 Contact project," 20th European Photovoltaic Solar Energy Conference, Jun. 6-10, 2005, Barcelona, Spain.
Jiang, et al., "Ethylene glycol-mediated synthesis of metal oxide nanowires," Journal of Material Chemistry, vol. 14, Jan. 21, 2004, pp. 694-703.
Meyers, et al., "Aqueous Inorganic Inks for Low-Temperature Fabrication of ZnO TFTs", Journal of American Chemical Society, vol. 130, Issue 51, Dec. 24, 2008, pp. 17603-17609.
Weaver, et al., "Organic light-emitting devices with extended operating lifetimes on plastic substrates," Applied Physics Letters, vol. 81, No. 16, Oct. 14, 2002, pp. 2929-2931.
Hu et al., "Low-temperature preparation of photocatalytic TiO2 thin films from anatase sols," Journal of Crystal Growth, vol. 27 4, No. 3-4, Jun. 3, 2005, pp. 563-568.
Campaniello, et al., "Preparation of textured alumina films by the sol-gel route," Journal Material Research, vol. 10, No. 2, Feb. 1995, pp. 297-301.
George, et al., "Surface Chemistry for Atomic Layer Growth," Journal of Physical Chemistry, vol. 100, No. 31, Aug. 1, 1996, pp. 13121-13131.
Yin et al., "Mild solution synthesis of zinc oxide filmswith superhydrophobicity and superdydrophilicity," Journal Material Chemistry, vol. 15, No. 42, Nov. 21, 2005, pp. 4584-4587.
Erlat, et al., "SiOx Gas Barrier Coatings on Polymer Substrates: Morphology and Gas Transport Considerations" Journal of Physical Chemistry, vol. 103, No. 29, Jul. 22, 1999, pp. 6047-6055.
Nisato, et al., "Evaluating High Performance Diffusion Barriers: the Calcium Test", 21st Annual Asia Display, 8th International Display Workshop, Nagoya, Japan, Oct. 2001.

(56) References Cited

OTHER PUBLICATIONS

Wu et al., "Assembly of Conducting Polymer/Metal Oxide Multilayer in One Step", Synthetic Metals 102 (1999) pp. 1268-1269.

Lewis et al., "Thin-Film Permeation-Barrier Technology for Flexible Organic Light-Emitting Devices", IEEE Journal of Selected Topics in Quantum Electronics, vol. 10, No. 1, Jan./Feb. 2004.

Leterrier et al., "Mechanical Properties of Transparent Functional Thin Films for Flexible Displays", 2003 Society of Vacuum Coaters 505/856-7188, 46th Annual Technical Conference Proceedings (2003) ISSN 0737-5921.

Graff et al., "Mechanisms of Vapor Permeation Through Multilayer Barrier Films: Lag Time Versus Equilibrium Permeation", J. Appl. Phys., vol. 96, No. 4, Aug. 15, 2004.

Erler et al., "Multi Layer Materials for the Encapsulation of Thin Film Modules", 3rd World Conference on Photovoltaic Energy Conversion, May 11-18, 2003, Osaka, Japan.

Lee et al., "Optimization of an Electron Transport Layer to Enhance the Power Conversion Efficiency of Flexible Inverted Organic Solar Cells," Nanoscale Research Letters, vol. 5, Issue 12, Aug. 31, 2010, pp. 1908-1912.

Beek et al., "Hybrid Poly-Inorganic Photovoltaic Cells," Hybrid Nanocomposites for Nanotechnology, Springer Science+Business Media, LLC, 2009, New York, NY, Chapter 8, pp. 321-385.

Beek et al., "Hybrid Solar Cells Using a Zinc Oxide Precursor and a Conjugated Polymer," Advanced Functional Materials, vol. 15, Issue 10, Oct. 2005, pp. 1703-1707.

Lloyd et al., "Influence of the hole-transport layer on the initial behavior and lifetime of inverted organic photovoltaics," Solar Energy Materials & Solar Cells, vol. 95, Issue 5, May 2011, pp. 1382-1388.

Oosterhout et al., "Hybrid Polymer Solar Cells from Zinc Oxide and Poly-(3-hexylselenohhene)," Journal of Physical Chemistry C, vol. 115, Issue 38, Sep. 29, 2011, pp. 18901-18908.

Pasquarelli et al., "Solution processing of transparent conductors: from flask to film," The Royal Society of Chemistry, vol. 40, Issue 11, Nov. 1, 2011, pp. 5406-5441.

Roth et al., "Properties of zinc oxide films prepared by the oxidation of diethyl zinc," Journal of Applied Physics, vol. 52, No. 11, Nov. 1981, pp. 6685-6692.

Sloof et al., "Influence of the Relative Humidity on the Performance of Polymer/TiO2 Photovoltaic Cells," Advanced Functional Materials, vol. 15, No. 4, Apr. 2005, pp. 689-694.

Denisov et al., "Study of the interaction of organometallic compounds with electron donors by the PMR method. 2. Complex formation of diethylzinc with tetrahydrofuran, diethyl ether, propylene oxide, and propylene sulfide," Bulletin of the Academy of Sciences of the USSR, Division of chemical science, vol. 24, Issue 12, Dec. 1975, pp. 2595-2597.

International Search Report and Written Opinion dated Jun. 18, 2014 for PCT Patent Application No. PCT/US14/21665.

Armstrong, et al., "Interface modification of ITO thin films: organic photovoltaic cells", Thin Solid Films, vol. 445, No. 2, 2003, pp. 324-352.

Brabec, et al., "Solution-Processed Organic Solar Cells", MRS Bulletin, vol. 33, Jul. 2008, pp. 670-675.

Choi, et al., "Diamond-like carbon as a buffer layer in polymeric electroluminescent device", Thin Solid Films, vol. 483, No. 1-2, 2005 pp. 351-357.

Lewis, et al., "Powering the planet: Chemical challenges in solar energy utilization", Proc. Nat. Acad. Sci., vol. 103, No. 43, Oct. 24, 2006, pp. 15729-15735.

Lin, et al., "Effect of fabrication process on the microstructure and the efficiency of organic light-emitting diode", Organic Electronics, vol. 10, No. 3, 2009, pp. 459-464.

Mashford, et al., "All-inorganic quantum-dot light-emitting devices formed via low-cost wet-chemical processing", Journal of Material Chemistry, vol. 20, No. 1, 2010, pp. 167-172.

Shaheen, et al., "Fabrication of bulk heterojunction plastic solar cells by screen printing", Applied Physics Letters, vol. 79, No. 18, Oct. 29, 2001, pp. 2996-2998.

Shaheen, et al., "Organic-Based Photovoltaics: Toward Low-Cost Power Generation", MRS Bulletin, vol. 10, Jan. 2005, pp. 10-15.

Steirer, et al., "Ultrasonically sprayed and inkjet printed thin film electrodes for organic solar cells", Thin Solid Films, vol. 517, No. 8, 2009, pp. 2781-2786.

Steirer, et al., "Enhanced Efficiency in Plastic Solar Cells via Energy Matched Solution Processed NiOx Interlayers", Advanced Energy Materials, vol. 1, 2011, pp. 813-820.

Yun, et al., "Pentacene Thin-Film Transistor with NiOx as a Source/Drain Electrode Deposited with Sputtering", Journal of the Electrochemical Society, vol. 155, No. 11 (2008), pp. H899-H902.

International Search Report and Written Opinion, dated Jan. 6, 2009, for International Application No. PCT/US08/82261.

\* cited by examiner

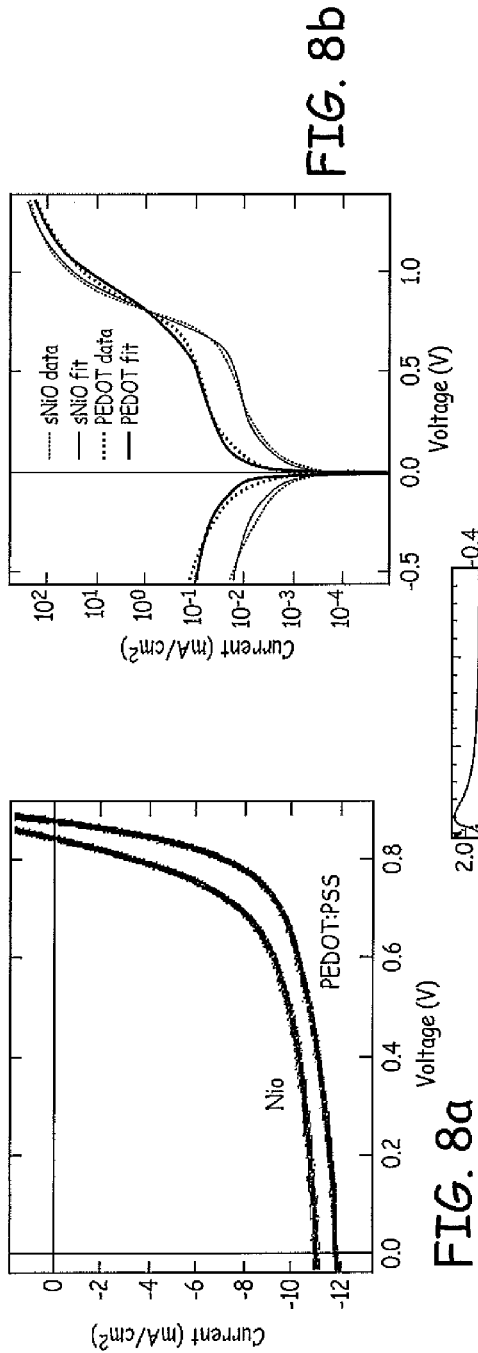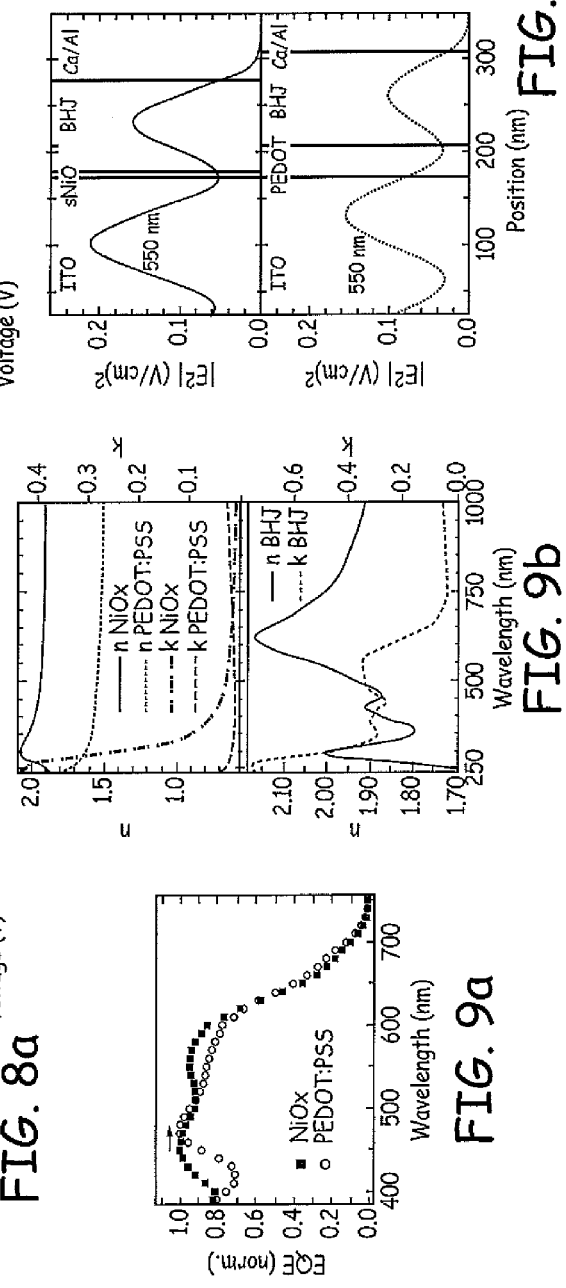
FIG. 8a
FIG. 8b
FIG. 9a
FIG. 9b
FIG. 9c

US 9,543,537 B2

SOLUTION PROCESSED METAL OXIDE THIN FILM HOLE TRANSPORT LAYERS FOR HIGH PERFORMANCE ORGANIC SOLAR CELLS

CROSS-REFERENCE TO RELATED APPLICATIONS

This application is a divisional of U.S. application Ser. No. 13/301,389, filed on Nov. 21, 2011, which claims the benefit of U.S. Provisional Application No. 61/415,612, filed on Nov. 19, 2010, which is incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

The present disclosure generally relates to organic solar cells and similar electronic devices. Today's increasing demand for renewable energy resources, especially solar power, is driving researchers to develop low cost, efficient photovoltaic devices. Organic photovoltaics (OPVs) are an attractive route toward solving the terawatt energy problem. In addition to the potential low cost of this technology, bulk heterojunction (BHJ) based solar cells can offer other advantages, such as flexibility, lightweight, and high throughput manufacturing, such as roll-to-roll and other similar techniques. BHJ systems have shown power conversion efficiencies (PCEs) of 4% to >7%. Organic solar cells have undergone a three-fold increase in PCE between 2001 and 2010, from about 2.5% to about 7.7%. These rapid gains may be a consequence of enhanced performance in polymer photovoltaic materials in BHJ solar cells. A benchmark goal for OPV researchers is to achieve a PCE in excess of 10%, which would help to make OPV competitive with other thin-film photovoltaic technologies. The ability to control the multiple interfaces within an OPV device may help achieve this and other objectives.

The foregoing examples of the related art and limitations related therewith are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in referenced figures of the drawings. It is intended that the embodiments and figures disclosed herein are to be considered illustrative rather than limiting.

FIG. 7b illustrates a vacuum energy level diagram for each layer of the OPV device of FIG. 7a.

FIG. 8a illustrates J-V curves for one sun illumination of a solar cell performance for BHJ devices utilizing NiO of PEDOT:PSS as the HTL.

FIG. 8b illustrates dark J-V measurements and corresponding fits for BHJ devices.

FIG. 9a illustrates a normalized EQE plot for PCDTBT:$PC_{70}BM$ BHJ devices with HTLs of NiO or PEDOT:PSS.

FIG. 9b illustrates optical constants n and k obtained for NiO, PEDOT:PSS, and PCDTBT:$PC_{70}BM$ (1:4) BHJ thin films in order to model the optical field in the solar cell.

FIG. 9c illustrates an optical field plot of 550 nm irradiation for a 100 nm BHJ layer shown for HTLs of NiO and PEDOT:PSS.

Corresponding reference characters and labels indicate corresponding elements among the view of the drawings. The headings used in the figures should not be interpreted to limit the scope of the claims.

DETAILED DESCRIPTION

Figure 1:
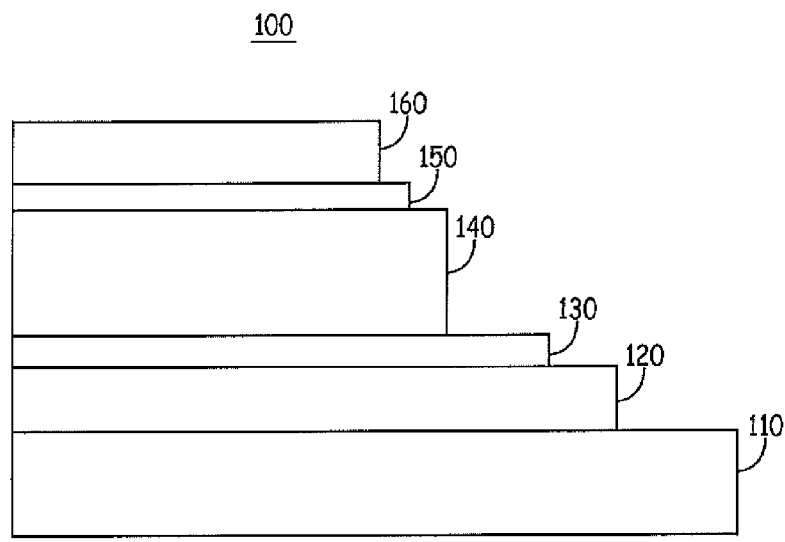
FIG. 1 illustrates a schematic diagram of an exemplary device structure of an organic photovoltaic device.

The working principle of bulk heterojunction (BHJ) solar cells relies on the intimate bi-continuous phase mixing of an electron donor and acceptor network. In order to improve charge generation in BHJ layers, a molecular engineering approach is employed to increase light absorption in the donor phase by reducing the effective band-gap. In addition to light harvesting, the open-circuit voltage ($V_{OC}$) of the solar cell may be improved by tailoring the polymeric repeat unit, such that the highest occupied molecular orbital (HOMO) level is pushed further from vacuum and the HOMO/lowest unoccupied molecular orbital (LUMO) energy offset of the electron donor/acceptor blend is increased. However, driving the donor HOMO level deeper may require a simultaneous change of the anode energy levels to ensure good energy level alignment and minimal loss at the hole collecting contact. Ideally, the hole transport layer (HTL) facilitates a low resistance, charge selective contact between the anode and the HOMO of the donor material, reducing a possible loss in built-in potential across the device.

Charge selective contacts may be utilized in active layer materials to enhance device performance. Poly(3,4-ethylenedioxythiophene):poly(styrenesulfonate) or PEDOT:PSS is a standard anodic contact for high efficiency organic photovoltaic (OPV) devices. PEDOT:PSS may function as an effective HTL by improving energy level alignment with the donor material, as well as limiting reverse electron transfer from the acceptor phase. However, PEDOT:PSS is acidic (pH of 1.2) and precludes the use of many pH sensitive transparent conducting oxides, such as ZnO-based electrodes containing aluminum or gallium. Furthermore, charge transport in PEDOT:PSS exhibits high resistivity that contributes to increased series resistance in polymer solar cells. Values for the work function of PEDOT:PSS vary between about −4.7 eV and −5.2 eV and may vary with the formulation of the supplier. For donor materials, such as P3HT, where the HOMO level is ~−5.0 eV, PEDOT:PSS modifies the work function of the ITO (4.7 eV) to establish an improved contact between the electrode and the donor material. However, in higher performance active layer systems, such as PCDTBT:$PC_{70}BM$, the HOMO level of the donor lies further from the vacuum level (~−5.4 eV) in order to minimize energy losses in the electron transfer process from the donor to accepter and maximize the photovoltage. The anode contact material should then have a deeper work function to minimize interfacial recombination and maximize the power conversion efficiency (PCE) of the device. In addition to forming an improved electronic interface with the BHJ, the ideal anodic contact will be resistant to degradation in the presence of oxygen and water to help improve device stability.

Amorphous, p-type metal oxides may be utilized as the hole transport layers (HTL) in solar cells, rather than PEDOT:PSS. Amorphous, p-type metal oxides are wide band gap (E9>3 eV), p-type materials that are transparent to the visible or near infrared portions of the solar spectrum. These metal oxides may minimize transparent conducting oxide (TCO)/donor contact resistance and the dark current by providing a large energy barrier to electron transfer while maximizing charge transfer between the TCO and the highest occupied molecular orbital (HOMO) of the donor material. Intrinsic stability and chemical compatibility with the active layer and the indium tin oxide (ITO) or other ZnO-based TCO materials may be promising for long device lifetimes. The basic approach also may have potential utility in the broader range of organic electronics, including organic light emitting devices (OLEDs), organic transistors, and other similar electronic devices.

One embodiment may comprise the application of solution deposited, p-type, amorphous metal oxide hole transport layers (HTL) for enhanced performance in organic photovoltaic (OPV) devices and related organic electronics. The p-type amorphous oxide may be derived from a metal-organic precursor that permits solution processing of the amorphous, p-type metal oxide. FIG. 1 illustrates a device structure, such as that of an OPV device 100. The OPV device 100 may include a substrate 110, an ITO layer 120, an HTL layer 130, an active layer 140, a calcium layer 150, and an aluminum layer 160. The active layer 140 may comprise a polymer:fullerene.

The active layer in BHJ cells may utilize a conjugated polymer as an electron donor, such as poly(3-hexylthiophene)(P3HT), that is intimately blended with a fullerene, as the electron acceptor, such as [6,6]-phenyl-$C_{61}$-butryric acid methyl ester (PCBM). Electrodes may consist of a transparent conducting oxide (TCO) anode, such as indium tin oxide (ITO), and a low work function metal cathode, such as calcium. The donor and acceptor phases may be in electrical contact with both of the electrodes, which may create a need for selective contacts to ensure proper device operation. A hole transport layer (HTL), such as poly(3,4-ethylenedioxythiophene):poly(styrenesulfonate) (PEDOT:PSS), may serve as an electron blocking layer (EBL) when deposited on the ITO electrode to suppress the dark current in these devices, in addition to serving as a lower resistance contact for hole extraction.

PEDOT:PSS may serve as both an HTL and as an EBL in normal and inverted device architectures, due to its band structure, which has a lower electron affinity (or higher lowest unoccupied molecular orbital (LUMO)) than P3HT, providing an energy barrier for electron transfer to the anode. The band offset of the HTL in a BHJ is important to establish the device polarity. However, PEDOT:PSS has been shown to degrade or limit device performance in multiple ways. Although the reported energy levels for PEDOT:PSS and P3HT vary dependent upon material preparation and measurement technique, the LUMO of PEDOT:PSS is essentially fixed at about 0.6 eV above the LUMO of P3HT, which may be insufficient as an electron barrier. The aqueous PEDOT:PSS suspension is also highly acidic, with a measured pH of 1.2. This prohibits use of PEDOT:PSS as an HTL on a number of high performance and low cost transparent conductors that are easily etched in acidic solutions. In addition, due to the hygroscopic nature of PEDOT:PSS films, water may be absorbed resulting in proton release and corrosion of the ITO anode subsequently allowing indium diffusion throughout the device. This, combined with the possible release of water from PEDOT:PSS into the active layer or the cathode can substantially degrade devices, lowering lifetimes and overall performance. These limitations have led to investigations of other materials to effectively replace PEDOT:PSS as the HTL in OPV devices.

An ideal candidate to replace PEDOT:PSS as the HTL would be a wide band-gap ($E_g$>3 eV), p-type material that is transparent to most of the solar spectrum. It should minimize TCO/donor contact resistance and the dark current by providing a large energy barrier to electron transfer, while maximizing charge transfer between the TCO and the highest occupied molecular orbital (HOMO) of the donor material. The HTL performance may also depend upon conductivity, but may vary with the junction type and loss mechanisms. Intrinsic stability and chemical compatibility with the active layer and the ITO or other ZnO-based TCO materials may also be important for long lifetimes. Metal oxide thin films may be an effective replacement for the typical PEDOT:PSS for the HTL layer in OPV systems, resulting in both increased device performance and lifetime. The metal oxide HTL materials may permit tunable contact properties through changes in composition, as well as through post-processing with an $O_2$-plasma of varied power and time.

Figure 2:
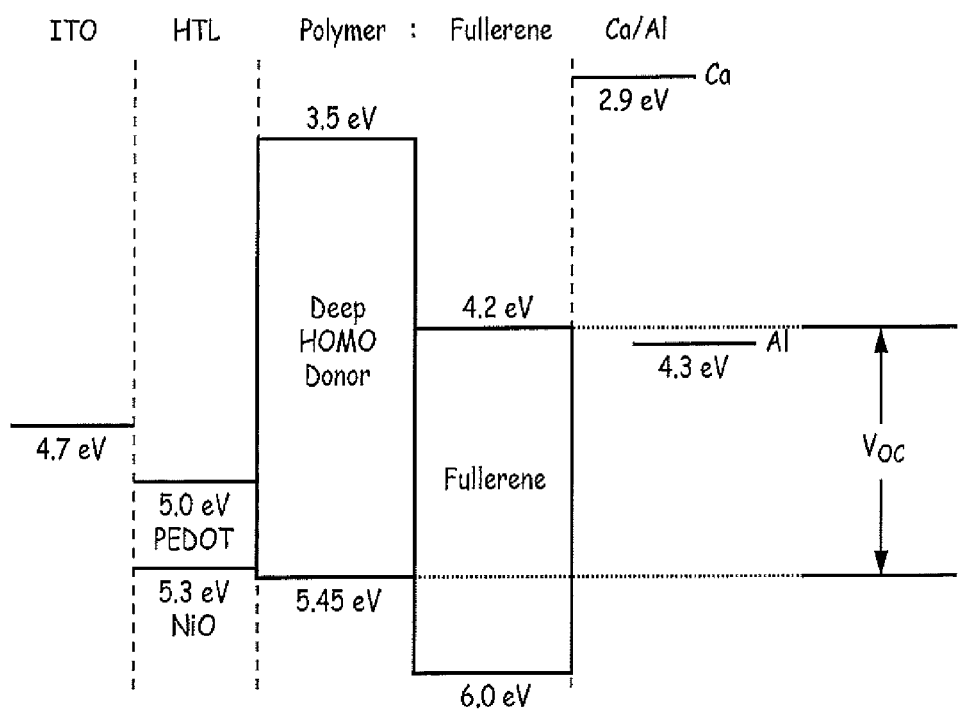
FIG. 2 is a schematic diagram of an energy level diagram depicting the components of an organic photovoltaic device of FIG. 1.

In a device structure, the HTL may act as both a low resistance (Ohmic) hole contact to the donor material, as well as an electron blocking contact to reduce recombination. An energy level diagram is shown in FIG. 2, depicting the relative location of the energy levels in the device stack. The p-type metal oxide thin films achieve work function values (>5.3 eV for NiO) that are higher than that for PEDOT:PSS (~5.0 eV), thus resulting in a reduced barrier for hole extraction at the anode, as well as achieving enhanced electric field in the device for improved charge collection from the bulk of the active layer. The p-type nature of the amorphous metal oxide may permit the formation of a selective contact for holes, as the electron levels in the acceptor lie in the gap of the p-type oxide, thereby preventing electron transfer to the anode and reducing interfacial recombination. Additionally, the metal oxide HTL materials demonstrate improved transmittance properties compared to PEDOT:PSS, which may permit more light to reach the active layer and thereby improve the photon harvesting of the solar cells. In addition to the improved device characteristics resulting in improved efficiency, the inorganic HTL also result in improved device lifetimes, compared to a device employing PEDOT:PSS. The improvements in the contact properties of the amorphous, p-type metal oxide HTL materials may further lead to improved performance in deep energy level donors in organic solar cells. By improving the contact properties, the photovoltaic and photocurrent may be increased in these systems beyond what may be achieved with PEDOT:PSS contacts.

The HTL of a PCDTBT/PCBM bulk heterojunction may also be p-NiO. Several materials have been identified as alternative HTL materials that may be applied by solution means. These include spinal structures, such as Co(Ni)Zn2O4 and delafossite structures, such as CuAlOx. Other p-types oxides are also anticipated in these applications. Since the layer is very thin film, it is not required to be entirely transparent. Accordingly, materials such as CuO may be suitable in these applications. Based upon various prerequisites, such as p-type, appropriate work function, solution processability, and relatively chemically inert, there are various, but not unlimited potential materials for this application. An appropriate HTL may be designed based upon the actual cell components. It is anticipated that a precursor solution may be employed to synthesize the amorphous metal oxide thin films. The NiO may be based on a metal-organic ink for the deposition of metal utilizing write solution processing contacts via ink-jet or continuous flow printing. This method may result in material with conductivities rivaling that produced by vacuum deposition. The ink is a complex in which the metal in solution coordinates to two diamine groups and is suspended in the solvent. At increased temperatures, the solvent and the metal organic decomposes leaving behind a high quality metal contact. The metal-organic precursor thin films may subsequently be annealed in air at elevated temperatures, in order to form the metal oxide thin films. Similar results have been obtained from solution precursors that do not require diamine complex in solution. Other ink chemistries may be employed for the diverse set of transition metals discussed above to obtain functional HTL layers.

The application of amorphous, p-type metal oxide thin films as contacts has numerous benefits for organic solar cells. For example, improved performance in terms of both efficiency and lifetime may be observed in these systems, relative to PEDOT:PSS. Additionally, the materials and processing costs may be very inexpensive, thereby permitting roll-to-roll deposition of these contacts at high speeds and high volumes. Still further, the metal oxide HTLs are chemically compatible with underlying transparent electrodes, thus, permitting the deposition of such materials on ZnO-based TCO materials, such as gallium-doped ZnO or aluminum-doped ZnO, which are sensitive to the acidic suspension that PEDOT:PSS is deposited from thereby prohibiting its use on these electrode materials.

Figure 3A:
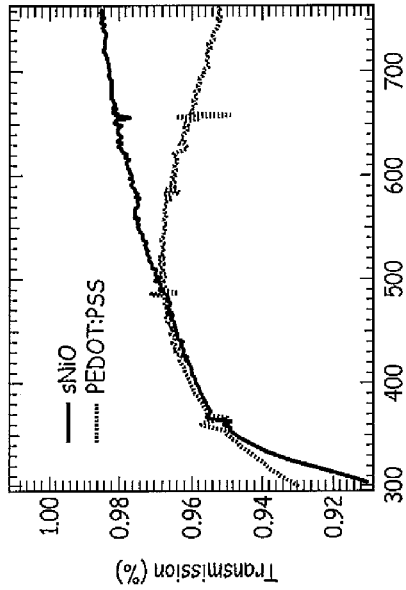
FIG. 3a illustrates an energy diagram of a NiO BHJ organic photovoltaic device.

As shown in the energy band diagram of FIG. 3a, a p-type metal oxide, such as NiO, has a wide band-gap and valence band energy close to the HOMO of P3HT. The high conduction band energy of NiO inhibits electron recombination with the anode, while the valence band permits efficient conduction of holes to the anode. Favorable vacuum energy level alignment and material stability indicate that NiO has many of the required characteristics of an efficient HTL material in OPV devices.

Furthermore, NiO may be deposited via pulsed laser deposition (PLD) and works well as an HTL for polymer solar cells, with devices exhibiting improved open-circuit voltage ($V_{OC}$), short-circuit current density ($J_{SC}$), and fill factor (FF) relative to a PEDOT:PSS control. The NiO is chemically stable and inert in relation to ITO and P3HT:PCBM. The work function ($\phi_W$) of the NiO film may be tailored by controlling the oxygen partial pressure during the deposition. Additionally, large increases in the work function may be induced by $O_2$-plasma treatment of the NiO prior to deposition of the active layer. Pulsed laser deposition is currently neither scalable nor a cost effective deposition method. A more cost effective and scalable deposition method may be solution deposited NiO (sNiO) followed by a lower temperature anneal, as an HTL to improve device efficiency and stability, while maintaining low-cost methods of production.

Figure 3B:
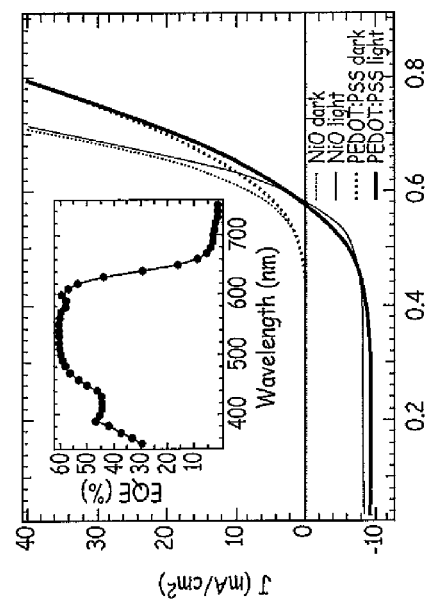
FIG. 3b illustrates a graph of transmission versus wavelength for sNiO and PEDOT:PSS on quartz substrates.

A sNiO film from a nickel metal organic ink precursor achieves similar OPV device performance to results seen with NiO films from PLD. The device structure, ITO/NiO/P3HT:PCBM/Ca/Al, is shown schematically in FIGS. 3a and 3b, which show that sNiO thin-films to be an effective replacement for PEDOT:PSS in OPV devices. As shown in FIGS. 3a and 3b, NiO provides favorable HTL properties, such as (1) a wide band-gap for transparency, (2) sufficient electron blocking energy, and (3) Fermi-level lineup with the HOMO of the donor for hole collection.

The work function is tunable in the sNiO films by post-processing with an $O_2$-plasma of varied power and time. The change in the work function with plasma treatment may be greater in magnitude and have a faster decay time than PLD based materials. The precursor solution used to synthesize the sNiO films may be based upon a nickel ink for the deposition of Ni using direct write solution processing contacts via ink-jet or continuous flow printing, resulting in material with conductivities rivaling that produced by vacuum deposition. The ink is a complex in which the Ni coordinates to two diamine groups, $[Ni(en)_2](HCO_2)_2$: en=$H_2N(CH_2)_2NH_2$, and is suspended in the solvent. At increased temperatures, the solvent and the metal organic decomposes, leaving behind a high quality metal contact. The complex may be hydrated by mixing 50% by volume DI water and may have a final Ni ink concentration of 0.34 M, as measured by inductively coupled plasma (ICP).

All films may be deposited onto patterned ITO (~10 Ω/sq, thin-film devices) substrates after approximately 5 minutes of ultrasonic cleaning in acetone, followed by isopropyl alcohol. Substrates may be plasma-cleaned prior to HTL deposition in approximately 0.8 Torr of $O_2$ at approximately 155 W. The sNiO films may be synthesized by spin-coating the diluted nickel ink at approximately 4000 rpm for approximately 60 seconds, followed by annealing on a hot plate in air at approximately 250° C. for approximately 1 hour, resulting in approximately 10 nm thick films.

The structural, optical, and electrical properties of sNiO films may be characterized. The grain-size and surface morphology may be examined. Reflectance and transmittance spectra were collected for the sNiO and PEDOT:PSS films on ITO over the UV, visible, and Near-Infrared (NIR) regions using a Shimadzu UV-3600 UV-Vis-NIR Spectrophotometer. Surface potential measurements were conducted using an Electrostatic Voltmeter (Monroe Electronics ISOPROBE 244A) in an inert atmosphere of $N_2$. The work function ($\phi_W$) of a material is often assumed to approximate the Fermi energy, but may include effects from both surface dipoles an changes in carrier concentration via doping or changes in defect densities. All $\phi_W$ measurements were taken relative to the Inconel™ stainless steel reference, which was measured to a $\phi_W$ of −4.33 eV, as determined from ultraviolet photoelectron spectroscopy (UPS). To examine the effect of surface treatments and processing procedures on the $\phi_W$ of NiO films, they were plasma treated using an RF $O_2$-plasma at various powers and treatment times with no bias applied to the substrate.

PEDOT:PSS films were used as the control HTL, two coats of PEDOT:PSS (Baytron P VP AL 4083 filtered to 0.45 μm using a nylon filter) were spin cast at 6000 rpm for 50 seconds, followed by a 1 hour anneal at 130° C. in air. For the $O_2$-plasma treated sNiO films, the active layer was immediately spun on in an inert atmosphere. A solution of 1:1 P3HT:PCBM (used as received from Rieke Metals and Nano-C, respectively) in 1,2-dichlorobenzene (50 mg/mL total) was stirred at 60° C. and 600 rpm for several hours prior to deposition at room temperature. The active layer was spun at 600 rpm for one minute, then allowed to slow dry in a covered petri dish for approximately 1 hour. After drying, the active layer was annealed at 110° C. for 10 minutes in $N_2$. Top electrodes were then deposited with 20 nm of Ca, followed by 100 nm of Al via thermal evaporation through a shadow mask to form six 0.11 cm² devices or one 1.0 cm² device on each substrate at a pressure of less than $7 \times 10^{-8}$ Torr.

Devices were characterized using a solar simulator housed in an inert atmosphere. Contact was made to both the ITO and Al electrodes, from which voltage was sourced and the resulting current was measured. The short-circuit current ($J_{SC}$) was calculated based on measured device areas of 0.11 cm² or 1.0 cm². Shunt resistance and series resistance ($R_s$) were calculated at 0 V and 0 mA/cm², respectively. External quantum efficiency (EQE) was measured without white light biasing the device on a system calibrated with a Si photo-diode illuminated with a Xe 300 W lamp chopped to create an excitation signal detected by lock-in amplification. Integrated EQE spectra were used to verify $J_{SC}$ values.

The sNiO films were characterized by atomic force microscopy (AFM) to evaluate the surface morphology and roughness. The root-mean square surface roughness of the films synthesized form the hydrated ink was 2.47 nm, as determined by AFM, which is similar to roughness values typically obtained for commercially available ITO. The optical transmittance and reflectance over the UV and visible spectrum of the sNiO films are comparable to PEDOT:PSS. The transmittance of the two films, shown in FIG. 3b, indicates that PEDOT:PSS is more transparent in the UV and at lower wavelengths, while sNiO is more transparent approaching the NIR wavelengths. The reflectance, however, indicates that PEDOT:PSS is slightly less reflective over most of the UV and visible compared to the sNiO film. Overall, the transmitted light that reaches the active layer is similar for both HTLs.

Figure 4:
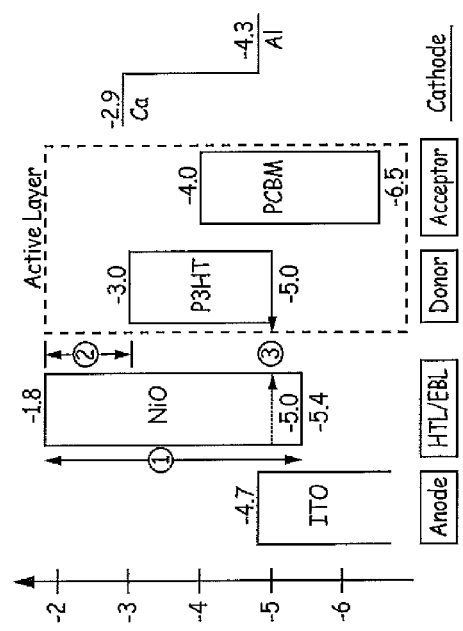
FIG. 4 illustrates the work function ($\phi_W$) response of sNiO films synthesized from Ni ink to $O_2$-plasma treatment.

To better determine the dependence of the work function with plasma treatment, the work function of sNiO films was measured in $N_2$ immediately after $O_2$-plasma treatment at 155 W. The $O_2$-plasma treatment power and exposure time were varied for sNiO films revealing significant differences in the measured work function. The main reactive components of the plasma, $O^-$ and $O^{2+}$ were assumed to drive oxidation of the Ni films. The results, shown in FIG. 4, demonstrate that sNiO films respond to plasma treatment by increasing the work function ($\phi_W$). The sNiO films display a saturation behavior at longer treatment times (~5 minutes), after which the $\phi_W$ no longer increased with further plasma treatment. The solar cells were stored in a dark inert environment and retested with sNiO and PEDOT:PSS over two weeks after fabrication. All OPV devices showed similar $V_{OC}$ degradation. This may be due to the sensitive Ca electrode dominating the degradation of the devices. Thus, the sNiO device HTL is, at a minimum, comparable to the PEDOT:PSS.

In order to determine the effect of the plasma treatment on sNiO, a time dependent work function study was conducted by measuring the work function every 20 seconds over a time-span of 2 hours in an inert atmosphere. It was observed that the work function ($\phi_W$) of films degraded quickly, as shown in the insert in FIG. 4. This would appear to indicate a change in the surface chemistry of the plasma treated sNiO. Because of the magnitude of the transient behavior in the work function, the experimental technique used to evaluate the work function, and the lack of measurable conductivity in the sNiO, this effect may be associated with a change in either the density of oxygen vacancies or the oxidation state of the Ni in the sNiO.

In order to compare the performance of solution deposited sNiO in OPV devices, BHJ solar cells were fabricated and tested under simulated one-sun conditions. The best sNiO-based devices were those $O_2$-plasma treated, so that the observed work function, immediately before deposition of the active layer was in the range of approximately −5.0 eV up to −5.6 eV. The optimized sNiO devices, resulted in PCE that are equivalent to PEDOT:PSS control devices. These devices utilized a sNiO HTL that has a work function of −5.6 eV before deposition of the active layer. Table 1 summarizes the results obtained via current-voltage characteristics of the solar cells with a spectral mismatch of 1.0.

TABLE 1

Solution NiO and PEDOT:PSS control device summaries.

| HTL | $V_{OC}$ (mV) | $J_{SC}$ (mA/cm²) | FF | PCE(%) | $R_{shunt}$ (Ω cm²) | $R_{series}$ (Ω cm²) |
|---|---|---|---|---|---|---|
| sNiO | 583 ± 5 | −8.6 ± 0.1 | 0.71 ± 0.004 | 3.6 ± 0.1 | 1600 ± 400 | 6.0 ± 0.2 |
| PEDOT:PSS | 578 ± 3 | −9.4 ± 0.3 | 0.66 ± 0.02 | 3.6 ± 0.1 | 2200 ± 300 | 8.1 ± 0.2 |

The thickness of the sNiO films may also have important effects. For example, thicker films may produce devices with lower $V_{OC}$, lower $J_{SC}$, and higher $R_S$. Thinner films may fail to produce uniform devices on a substrate, causing inconsistent performance, perhaps due to incomplete surface coverage. A thickness of approximately 10 nm was found to be satisfactory for PLD deposited NiO films with an active layer thickness of about 220 nm. This thickness of the active layer blend, however, may be different for devices with sNiO, as opposed to PEDOT:PSS. Referring again to Table 1, the sNiO devices showed higher FF, slightly lower $J_{SC}$ and similar $V_{OC}$, in relation to the PEDOT:PSS control device. This leads to similar PCE of 3.6% for both sNiO and PEDOT:PSS HTLs. Series and shunt resistances were calculated by taking the inverse slopes at $V_{OC}$ and $J_{SC}$, respectively. The series resistance is lower in the sNiO devices, as compared to PEDOT:PSS. The decrease in series resistance in the sNiO OPV devices may be due to reduced contact resistance at the ITO/sNiO and sNiO/active layer interfaces.

Figure 5:
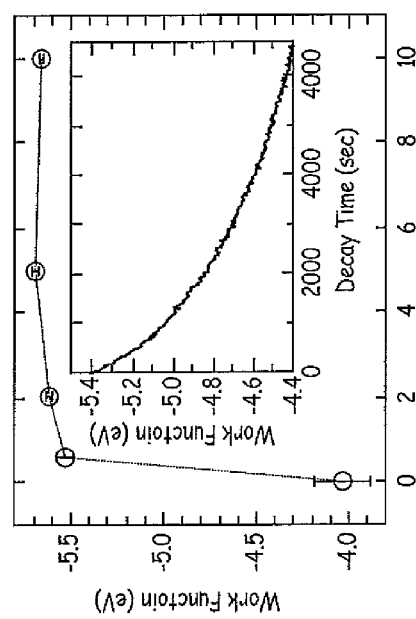
FIG. 5 illustrates the current-voltage characteristics of PEDOT:PSS and sNiO-based devices.

FIG. 5 illustrates the current-voltage characteristics of PEDOT:PSS and sNiO-based devices. An unexpected aspect of the device performance is the sNiO films with much deeper observed work function than the assumed optimal −5.0 eV worked best. The plasma treatment of these films may produce better functioning devices with non-treated films exhibiting poor FF and low $V_{OC}$. It is possible that the plasma treatment may be cleaning off any organic contaminants or remaining solvent at the surface, revealing a higher work function sNiO beneath. Or it may be that the surface oxidation state is shifted during $O_2$-plasma treatment, either reducing a tunnel barrier or pinning the P3HT HOMO level closer to the NiO valence band. However, higher than expected work function indicates that there may be charging of the surface from the plasma, and it is subsequently degrading quickly over time. It is most likely that there is surface oxidation, which will change the work function and the doping of the p-type NiO thin-film, modestly increasing conductivity, while facilitating good ohmic contact, hole collection, and electron blocking characteristics.

Other mechanisms may not be ruled out, which may result in effective charge transport at this interface, such as Fermi-level pinning. However, these types of interfacial mechanisms suggest that more relevance be placed on the electric field, and therefore, surface doping in the sNiO layer than the measured work function of the layer. Before recombination may occur, a high electric field may accelerate the already dissociated charge carrier toward the proper electrode. Higher electric fields may, therefore, correspond to enhanced current collection. Solution process NiO may be used in lieu of PLD NiO thin-films in BHJ OPV devices. Furthermore, sNiO is an effective replacement for PEDOT:PSS as an HTL. There are similar efficiencies for solar cells with sNiO compared to PEDOT:PSS controls. Both the precursor ink formulation and the processing conditions produced 10 nm sNiO HTL films that enable both electron blocking and hole collection indicative of high-quality, selective contacts essential for BHJ devices.

In another embodiment, a solution deposited NiO HTL to modify the transparent ITO electrode may enable a PCE of 6.7%. The organic active layer system may attain high $V_{OC}$ (~880 mV) due to the low-lying HOMO level of a PCDTBT donor material. Improved performance of this system may therefore require contact layers with deeper work function than PEDOT:PSS. Ultraviolet and inverse photoelectron spectroscopy (UPS, IPES) show the work function of NiO is well matched to the HOMO level of the PCDTBT donor material. The PCDTBT organic solar cells utilizing NiO HTLs outperform PEDOT:PSS solar cells in every device metric. An optical model utilizing multilayer matrix theory (MMT) is employed to assess gains in short circuit current ($J_{SC}$). The $V_{OC}$ increase analysis is made from diode modeling of the dark current. Additionally, lifetime measurements demonstrate the enhanced stability under constant illumination of non-encapsulated devices utilizing a NiO HTL.

NiO demonstrates a deep work function HTL, where NiO surface treatments and the NiO/organic interface play a role in determining device performance. When used as and HTL, the surface of the solution processed NiO film, exclusively employed here, may benefit from exposure to oxygen plasma to establish an appropriate work function immediately before deposition of the active layer. A similar mechanism may take place for the surface of the ITO.

Figure 6C:
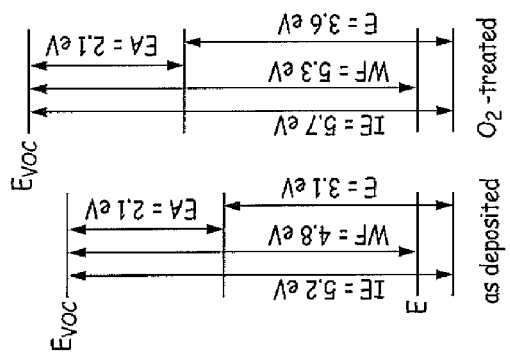
FIG. 6c illustrates the energy level diagrams of NiO before and after $O_2$-plasma treatment.
Figure 6B:
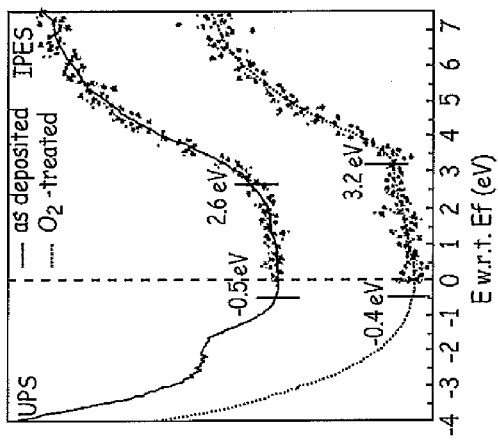
FIG. 6b illustrates the combined UPS and IPES spectra of the NiO near the valence and conduction band edge.
Figure 6A:
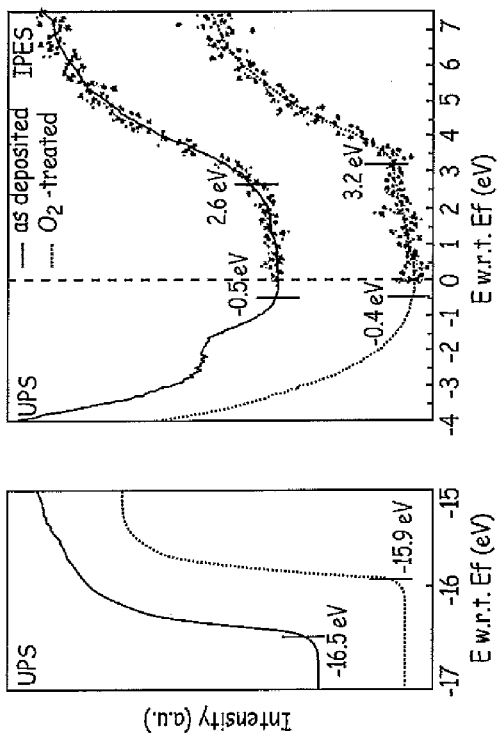
FIG. 6a illustrates the UPS spectra (HeI) of the photoemission cut-off showing an increasing work function after $O_2$-plasma treatment of the NiO.

Ultraviolet and inverse photoelectron spectroscopy (UPS, IPES) measurements of the density of states near the valence band edge and conduction band edge and resulting band energies are shown in FIGS. 6a, 6b, and 6c, which illustrate the effects of $O_2$-plasma on NiO. The photoemission cut-off shown in FIG. 6a indicates an increase of the work function ($\phi_W$) from −4.75 eV to −5.32 eV upon $O_2$-plasma treatment of NiO. These results are consistent with observed changes in the work function difference for NiO films measured in either air or nitrogen using Kelvin probe techniques. The ionization energy (IE), defined as the energy difference between valence band edge and vacuum level, increases by 0.5 eV following $O_2$-plasma treatment to a value of −5.7 eV. In contrast, the $O_2$-plasma does not affect the electron affinity (EA), which remains constant at −2.1 eV. In addition, FIG. 6b shows that the valence band edge is placed very close (0.4 eV) below the Fermi level, indicating that NiO is a p-type material. A summary of the UPS and IPES results in the form of energy level positions is given in FIG. 6c, which shows the energy level diagrams of NiO before and after $O_2$-plasma treatment.

The energy diagram indicates three attributes of NiO that may result in a high performance HTL. First, $O_2$-plasma treated NiO has a high work function, facilitating contact with the deep HOMO of the donor material. Second, the position of the conduction band edge, 2.1 eV from vacuum, may permit NiO to serve as an effective electron blocking layer to prevent electron recombination at the anode. Third, NiO is a wide band-gap (3.6 eV, when $O_2$-plasma treated) HTL leading to high transmission throughout the absorption spectrum of the active layer. In contrast to PEDOT:PSS, the transmission of NiO is higher for wavelengths above 500 nm. Thus, employing NiO as an HTL affords high optical transparency, low resistivity, and excellent energy level alignment with the HOMO level of the donor.

Thin films of NiO deposited from physical vapor or solution processes produce PCE values similar to PEDOT:PSS in canonical OPVs with BHJ layers of poly(3-hexyl-thiophene) (P3HT):$PC_{60}BM$. For comparison, power conversion efficiencies of 6.1% have been reported for PCDTBT:$PC_{70}BM$ solar cells when PEDOT:PSS was used as the HTL in conjunction with $TiO_x$ as the electron transport layer (ETL) and optical spacer.

Figure 7B:
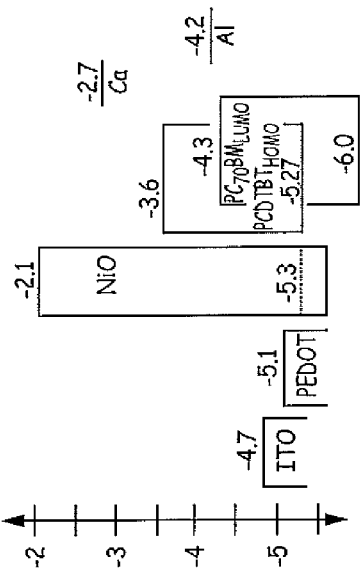
Figure 7A:
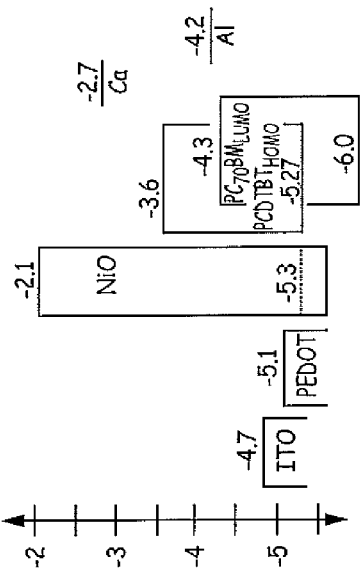
FIG. 7a illustrates an OPV device layer structure utilizing a PCDTBT:$PC_{70}BM$ BHJ of 100 nm thickness interfaced with a solution deposited HTL.

FIG. 7a illustrates an OPV device layer structure utilizing a PCDTBT:$PC_{70}BM$ BHJ of 100 nm thickness interfaced with a solution deposited HTL (either NiO with a work function of −5.3 eV and thickness of 6 nm or PEDOT:PSS HTL with a work function of −5.1 eV and a thickness of 34 nm). The active layer thickness is 100 nm for all devices, as determined by stylus profilometry. The vacuum energy level diagram for each material in the OPV device is shown schematically in FIG. 7b. Hole transport to the ITO is improved utilizing NiO as the HTL, whereas reverse transfer of electrons is blocked by the high conduction band level of NiO.

Current density versus voltage (J-V) measurements were taken in the dark and under simulated one-sun illumination. A comparison of the light and dark J-V measurements for both NiO and PEDOT:PSS based devices is presented in FIGS. 8a-8b and Table 2. The PCDTBT:$PC_{70}BM$ devices employing a PEDOT:PSS HTL exhibit an average $V_{OC}$ of 845 mV, $J_{SC}$ of 11.01 mA/cm$^2$, and a FF of 0.60 to yield a PCE of 5.7%. With the NiO HTL there is a 17.3% increase in device performance with an average $V_{OC}$ of 879 mV, $J_{SC}$ of 11.5 mA/cm$^2$, FF of 0.65, and PCE of 6.7%. This result differs from studies of P3HT:$PC_{60}BM$ solar cells that demonstrated similar $V_{OC}$ values for NiO and PEDOT:PSS. This difference may be explained by comparing the HOMO levels of the donors and energy level alignment with the HTL, resulting in the Fermi level pinning in NiO to PCDTBT, whereas there would be none with PEDOT:PSS. Previous studies indicate that P3HT has an HOMO level between −4.8 and −5.1 eV. UPS measurements of the work function for ITO/PEDOT:PSS and ITO/NiO films lead to values of −5.1 eV and −5.3 eV, respectively. In the case of PCDTBT, however, the device performance clearly demonstrates that PEDOT:PSS fails to achieve the maximum $V_{OC}$ for the lower-lying HOMO level of PCDTBT. The work function of NiO is more closely aligned with the −5.45 eV HOMO level of PCDTBT which may mitigate the loss mechanisms that are suffered with the PEDOT:PSS HTL.

TABLE 2

Device characteristics and ITO/HTL $\phi_W$ for PCDTBT:PC$_{70}$BM BHJ solar cells with NiO and PEDOT:PSS HTLs

| HTL | $V_{OC}$ (mV) | $J_{SC}$ (mAcm$^2$) | FF | PCE (%) | $\phi_W$ (eV) |
|---|---|---|---|---|---|
| sNio | 879 ± 7 | −11.5 ± 0.4 | 0.65 ± 0.01 | 6.7 ± 0.1 | −5.4 |
| PEDOT:PSS | 845 ± 8 | −11.1 ± 0.1 | 0.60 ± 0.01 | 5.7 ± 0.1 | −.51 |

In order to elucidate the cause for increased $V_{OC}$ in the devices with NiO, a standard diode model was employed, which includes the parallel and serial resistance of the diode in Equation 1.

$$J=(V-JR_s)/R_p-J_{sat}\exp(V-JR_s)/nkT \quad \text{(Equation 1)}$$

In Equation 1, J is the measured current density, V is the applied bias, $R_p$ is the parallel resistance, $J_{sat}$ is the saturation current, n is the diode ideality factor, T is ambient temperature, and k is the Boltzmann constant. When fitting with this model, the changes in $V_{OC}$ may be inferred following Equation 2.

$$V_{OC} \approx (nkT/q)\ln(J_{sc}/J_{sat}) \quad \text{(Equation 2)}$$

In Equation 2, $J_{sc}$ is the short circuit current. Fits of the data to the model are shown in FIG. 8a and resultant parameters, including relative errors are reported in Table 3. The predicted increase in $V_{OC}$ (16 mV) from Equation 2 is due to a large decrease in $J_{sat}$ and is verified by the measured J-V data under illumination. With the NiO contact, the calculated diode ideality factor, n improves from 2.3 to 1.6, with a corresponding decrease of several orders of magnitude in $J_{sat}$ from 2.6×10$^{-6}$ to 2.3×10$^{-9}$ mAcm$^{-2}$. For organic solar cells, improvements in the exponential regime of the diode, where $J_{sat}$ and n dominate, has been correlated with increases in $V_{OC}$. Changes in $J_{sat}$ are indicative of the ability of current to overcome the energy barrier at the HTL/BHJ interface in the reverse direction. The $J_{sat}$ is likely reduced with selective harvesting of positive charges and reduced electron back transfer. Hence anode enhanced forward charge transfer may account for increases to the $J_{sc}$, while the carrier selectivity improves the $V_{OC}$. A reduction in the carrier recombination and an increase in charge collection combine to give the improvement in FF observed for the NiO devices.

In addition to improved $V_{OC}$ and FF, there is also a modest increase of $J_{sc}$ for NiO. Normalized external quantum efficiency (EQE) for BHJ devices with PEDOT:PSS and NiO HTLs are shown in FIGS. 9a, 9b and 9c, along with HTL optical properties and the MMT results. To analyze changes in $J_{SC}$ with MMT modeling, the EQE spectra for wavelengths between 330 nm and 800 nm are calculated and the photon absorption is integrated over the entire BHJ thickness. Assuming identical internal quantum efficiencies, and integrating the optical fields over these wavelengths result in similar energy dissipation for both HTLs with only a slightly higher value for NiO. This indicates that the NiO HTL in place of the PEDOT:PSS layer does not sufficiently alter the optical resonance within the BHJ layer to account for the experimentally observed increase in $J_{SC}$.

Differences in EQE curve shapes result from a combination of changes in thickness and optical properties of the HTLs and are displayed as a peak redshift from 450 nm to 480 nm in FIG. 9a. However, as the shift in peak resonance is not sufficient to entirely account for the increased photocurrent, the enhanced $J_{SC}$ is attributed to improved transmission coupled to decreased recombination at the NiO/BHJ interface. As seen in FIG. 9a, peaks at 450 nm and 550 nm are clearly visible for devices with NiO. A redshifted peak at 480 nm is shown for PEDOT:PSS due to the thicker HTL. FIG. 9b shows optical constants n and k obtained for NiO, PEDOT:PSS, and PCDTBT:PC$_{70}$BM (1:4) BHJ think films, in order to model the optical field in the solar cell. Optical constants were calculated from spectroscopic ellipsometry measurements. FIG. 9c shows an optical field plot of 550 nm irradiation for a 100 nm BHJ layer shown for HTLs of NiO and PEDOT:PSS. Small differences in field strength account for changes to EQE, but do not entirely explain the increase in $J_{SC}$.

Figure 10:
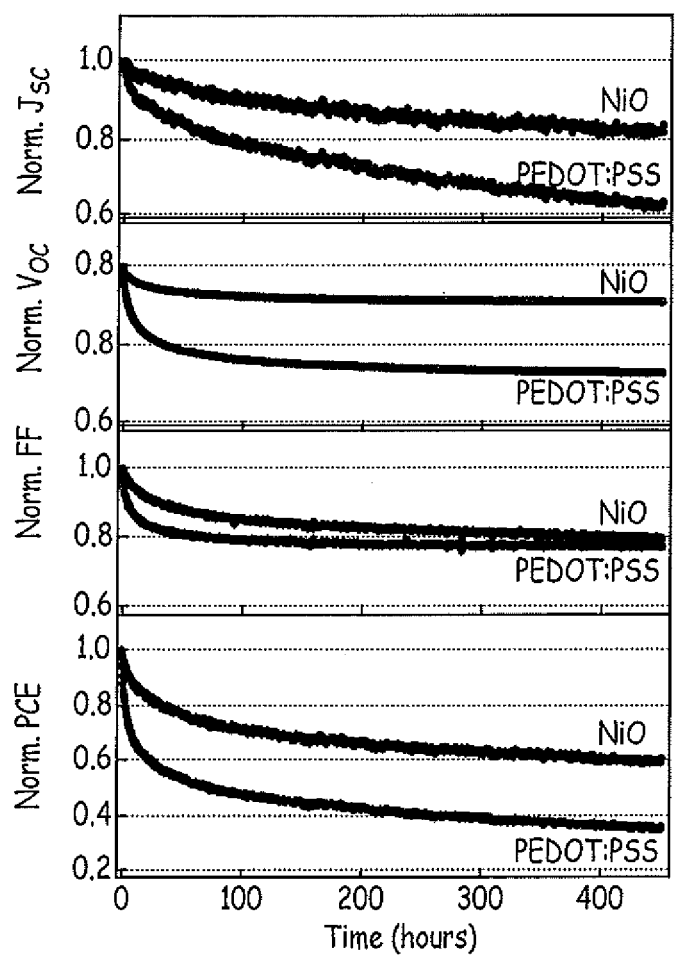
FIG. 10 illustrates degradation plots comparing NiO to PEDOT:PSS HTLs in ITO/HTL/PCDTBT:$PC_{70}BM$/Al photovoltaic devices.

In order to investigate the effects of the NiO HTL on device stability, the lifetime of the non-encapsulated PCDTBT:PC$_{70}$BN solar cells was assessed. An all aluminum top electrode was used in these experiments to reduce effects related to the oxidation of Ca that would otherwise dominate the device evolution. Devices were exposed to constant ~0.7 sun illumination near the maximum power point, and J-V characteristics were recorded at 30 minute intervals. Device parameters for 450 hours of testing initiated on the day of device fabrication are shown in FIG. 10. Instabilities within the active layer and top electrode clearly contribute to the overall degradation.

In the data shown in FIG. 10, the HTL should be largely responsible for the different rates found in the non-encapsulated device lifetimes. All device parameters for the NiO HTL, including $V_{OC}$, $J_{SC}$, FF, and PCE exhibit lower decay rates than those for PEDOT:PSS. The exponential drop in $V_{OC}$ over the initial 10-50 hours found in both PEDOT:PSS and NiO samples is likely the result of oxidation of aluminum electrode after the devices have been exposed to air. As the aluminum oxidizes, a corresponding increase in the work function ($\phi_W$) would act to reduce the internal electric field

TABLE 3

Dark diode model fit results with errors of one standard deviation and predicted $V_{OC}$ for each HTL calculated for Equation 2.

| HTL | n | $R_p$ (Ωcm$^2$) | $R_s$ (Ωcm$^2$) | $J_{sat}$(mAcm$^{-2}$) | Predicted $V_{OC}$ (mV) |
|---|---|---|---|---|---|
| NiO | 1.6 ± 0.1 | 1.4E+5 ± 1E4 | 1.40 ± 0.15 | 2.3E−9 ± 1E−9 | 924 |
| PEDOT:PSS | 2.3 ± 0.3 | 1.5E+4 ± 1E3 | 1.43E ± 0.19 | 2.6E−6 ± 2E−6 | 908 | in the device, resulting in a lower $V_{OC}$ and reduced driving force for current collection. The relative loss in $V_{OC}$ over time is significantly reduced in the case of the NiO, which is again consistent with the larger $\phi_W$ of NiO that acts to maintain the asymmetric electric field in the device after the rate for the organic HTL stems from the hygroscopic nature of PEDOT:PSS. Uptake of atmospheric water vapor has been shown to increase the resistivity of the PEDOT:PSS and was reported as a main cause of rapid degradation in OPV devices. The low pH of PEDOT:PSS has also been implicated in degrading the hole collecting ITO/PEDOT:PSS interface due to etching ITO, an effect not replicated at the ITO/NiO interface.

In summary, NiO significantly outperforms PEDOT:PSS as an HTL for anodic contact in a PCDTBT:PC$_{70}$BM BHJ solar cell in both device performance and stability. UPS/IPES show that the oxygen plasma treatment of the solution deposited NiO increases the $\phi_W$ enabling the formation of a charge selective contact with the PCDTBT:PC$_{70}$BM active layer. By comparing solar cell device performance to the PEDOT:PSS, comprehensive improvements are observed, resulting in a PCE of 6.7%. This is largely the result of a reduced diode factor (n), a $10^3$ reduction of $J_{sat}$, and enhanced transmission leading to increase in $V_{OC}$, $J_{SC}$, and FF. Additionally, the stability of device performance is increased with NiO relative to PEDOT:PSS, likely due to the preservation of the internal electric field with the higher $\phi_W$ HTL and the deterioration of PEDOT:PSS after exposure to water vapor. The 17.3% net increase in PCE coupled to improved environmental stability resulting from the optimized contact demonstrates the role of the HTL/BHJ interface for maximizing performance of organic solar cells.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

What is claimed is:

1. A method comprising:
   forming an indium tin oxide (ITO) layer on a substrate;
   depositing a hole transport layer (HTL) on the ITO layer, wherein the HTL comprises an amorphous, p-type NiO;
   annealing the HTL;
   forming an active layer on the annealed HTL, wherein the active layer comprises a donor region and an acceptor region; and
   forming a contact on the active layer, wherein:
   the contact comprises a cathode, and
   the depositing is performed by spin-coating a diluted nickel ink on the ITO layer.

2. The method according to claim 1, wherein the active layer comprises a polymer and a fullerene.

3. The method according to claim 2, wherein the polymer comprises poly(3-hexylthiophene) (P3HT) and the fullerene comprises [6,6]-phenyl-C$_{61}$-butyric acid methyl ester (PCBM).

4. The method according to claim 1, wherein the spin-coating is performed at approximately 4000 rpm for approximately 60 seconds, and the annealing is performed at a temperature of approximately 250° C. for a period of time of approximately 1 hour.

5. The method according to claim 1, wherein the spin-coating is performed at approximately 4000 rpm, and the annealing is performed in air.

6. The method according to claim 1, wherein the HTL forms a thin-film.

7. The method according to claim 6, wherein the thin-film has a thickness of approximately 10 nm.

8. The method according to claim 1, wherein the active layer comprises a PCDTBT/[6,6]-phenyl-C$_{61}$-butyric acid methyl ester (PCBM) bulk heterojunction.

9. The method according to claim 1, further comprising:
   exposing the HTL to an oxygen plasma after the depositing.

10. A method comprising:
    forming a transparent conducting oxide (TCO) layer on a substrate; and
    forming a hole transport layer (HTL) on the TCO layer by solution deposition of a metal-organic ink using ink-jet or continuous flow printing, wherein:
    the HTL comprises an amorphous, p-type metal oxide, and
    the metal-organic ink comprises a complex in which the p-type metal oxide is in solution and coordinates to one or more diamine groups suspended in a solvent.

11. The method according to claim 10, further comprising:
    annealing the metal-organic ink in air after the solution deposition.

12. The method according to claim 10, wherein the TCO comprises a ZnO-based material.

13. The method according to claim 12, wherein the ZnO-based material is gallium-doped.

14. The method according to claim 12, wherein the ZnO-based material is aluminum-doped.

15. The method according to claim 10, further comprising:
    exposing the HTL to an O$_2$-plasma treatment after the HTL is formed.

16. The method of claim 10, further comprising:
    forming an active layer on the HTL, wherein the active layer comprises a donor region and an acceptor region; and
    forming a contact on the active layer, wherein the contact comprises a cathode.

17. A method comprising:
    forming an indium tin oxide (ITO) layer on a substrate;
    forming by solution deposition a hole transport layer (HTL) on the ITO layer, wherein the HTL comprises an amorphous, p-type NiO; and
    forming an active layer on the HTL, wherein the active layer comprises a PCDTBT/[6,6]-phenyl-C$_{61}$-butyric acid methyl ester (PCBM) bulk heterojunction.

* * * * *